(12) United States Patent
Berman (10) Patent No.: US 9,370,129 B2
(45) Date of Patent: Jun. 14, 2016

(54) CABLE SUPPORT SHIELD TERMINATION DEVICE

(71) Applicant: The Boeing Company, Chicago, IL (US)

(72) Inventor: Steven Michael Berman, Seattle, WA (US)

(73) Assignee: The Boeing Company, Chicago, IL (US)

( * ) Notice: Subject to any disclaimer, the term of this patent is extended or adjusted under 35 U.S.C. 154(b) by 279 days.

(21) Appl. No.: 14/245,472

(22) Filed: Apr. 4, 2014

(65) Prior Publication Data

US 2015/0288105 A1    Oct. 8, 2015

(51) Int. Cl.
  *H01R 13/648*  (2006.01)
  *H01R 9/00*    (2006.01)
  *H01R 13/40*   (2006.01)
  *H05K 9/00*    (2006.01)

(52) U.S. Cl.
  CPC ............... *H05K 9/00* (2013.01); *H05K 9/0098* (2013.01); *Y10T 29/49947* (2015.01)

(58) Field of Classification Search
  CPC ..... H01R 13/6581; H05K 9/00; H05K 9/0098
  USPC .................................. 174/350, 359; 439/598
  See application file for complete search history.

(56) References Cited

U.S. PATENT DOCUMENTS

| 4,613,198 | A | * | 9/1986 | Selvin | ................ | H01R 13/5804 439/660 |
|---|---|---|---|---|---|---|
| 5,052,947 | A | | 10/1991 | Brodie et al. | | |
| 5,211,576 | A | * | 5/1993 | Tonkiss | ................ | H01R 13/59 439/462 |
| 5,718,559 | A | * | 2/1998 | Freund | ................... | G11B 17/08 294/185 |
| 6,196,865 | B1 | * | 3/2001 | Ruffel | ................... | H01R 13/56 439/470 |
| 6,419,519 | B1 | | 7/2002 | Young | | |
| 7,544,085 | B2 | | 6/2009 | Baldwin et al. | | |
| 2004/0121650 | A1 | * | 6/2004 | Lazaro | ................... | H01R 9/032 439/598 |
| 2009/0126985 | A1 | * | 5/2009 | Aoki | ................... | H02G 3/0683 174/377 |

* cited by examiner

*Primary Examiner* — Sherman Ng
(74) *Attorney, Agent, or Firm* — Ostrager Chong Flaherty & Broitman P.C.

(57) ABSTRACT

Methods and devices for providing strain relief in a region between a cable clamp and a shield termination ring of a wire harness termination assembly in a vibration environment. The devices are in the form of a shield termination ring having an extended member joined to or integrally formed with a curved cable clamp insert. The extended member in turn may be joined to or integrally formed with the shield termination ring. The purpose of the extended arm and curved cable clamp insert is to provide support to the portion of the wire harness disposed between the cable clamp and the shield termination ring, thereby reducing shield braid and wire insulation fatigue in that area.

22 Claims, 6 Drawing Sheets

CABLE SUPPORT SHIELD TERMINATION DEVICE

BACKGROUND

This disclosure generally relates to devices and methods for providing support to wire harnesses in a vibration environment. In particular, this disclosure relates to devices and methods for providing support to a wire harness that is coupled to a backshell assembly comprising a backshell, strain relief arms, and a cable clamp.

A wire harness is an assembly of cables or wires which transmit signals or electrical power. The cables are bound together by straps, cable ties, cable lacing, sleeves, electrical tape, a conduit, a weave of extruded string, or a combination thereof. By binding many wires or cables into a wire harness, the wires or cables can be better secured against the adverse effects of vibration, abrasion, and moisture.

In cable assemblies, wires and cables of a wire harness act as antennas to pick up and/or radiate noise from and/or to other cables. One solution to this cross-talk problem is to apply conductive braided shielding around cable conductors, and attach the shielding to an electrical ground, thereby reducing or eliminating any effects of any electrical and magnetic fields resulting from such radiation.

It is known to terminate a wire harness at a cable termination and grounding assembly. A cable termination and grounding assembly can be used as an electromagnetic interference (EMI)/high-intensity radiated field (HIRF) grounding device providing high surface transfer impedance shielding, noise immunity and susceptibility at all frequency ranges and as a strain relief device providing mechanical support or both in an assembly of electrical shielded cable. Each cable typically includes numerous wires that are connected to a connector and at least one electrically conductive shield or braid that offers protection from electromagnetic emissions, electromagnetic susceptibility, and electromagnetic crosstalk between wires of one or more cables. The shield must be properly terminated at the connector. In many cable termination and grounding assemblies, the signal wire connections and the shield terminations are covered by a backshell, which is a cover that is coupled to the connector to provide protection from physical contact and prevent electromagnetic interference (EMI) from outside sources and electromagnetic emissions from the cable wires. An electrically conductive cable overbraid shield is terminated to the backshell to prevent radiation from entering at the backshell/shield interface.

Many known backshell assemblies provide a transition from a plurality of electrical conductors to an electrical connector. In particular, some backshell assemblies comprise a mechanical cable clamp that provides a radial clamping force relative to a wire bundle to prevent axial forces from damaging the termination of the wires at the electrical connector. This cable clamp may comprise a pair of saddle bars coupled to the backshell by means of pivotable strain relief arms and joined to each by conventional fasteners.

In addition, it is known to provide a split shield termination ring which is placed around a portion of a shielded cable at a short distance from the aforementioned cable clamp of the backshell assembly. Typically the overall braided shielding surrounding the cable is folded back over the shield termination ring. Later the overall braided shielding from the backshell assembly is pulled over the folded-back cable braided shielding.

In some circumstances, a connector-backshell-shield termination ring installation of the above-described type may exhibit shield braid and wire insulation fatigue failures in service due to the existing vibration environment. The installation may allow the wire harness and the shield termination ring to move excessively, causing shield braid and wire insulation fatigue failures between the backshell and the shield termination ring. This is a result of a lack of strain relief in the region to the rear of the backshell cable clamp.

One proposed solution is to wrap the harness with tape from the shield termination ring to a point near the connector. Another proposed solution is to install rubber sleeving. Both of these solutions require wrapping the harness with tape, which is time consuming and may not adequately prevent excess flexure of the harness in service.

An installation is needed that will reduce or prevent movement of the wire harness and the shield termination ring when a wire harness termination assembly is in service.

SUMMARY

The subject matter disclosed herein is directed to methods and devices for providing strain relief in the region between a cable clamp and a shield termination ring of a wire harness termination assembly in a vibration environment. The devices are in the form of a shield termination ring having an extended member joined to or integrally formed with a curved cable clamp insert. The extended member in turn may be joined to or integrally formed with the shield termination ring. The purpose of the extended arm and curved cable clamp insert is to provide support to the portion of the wire harness disposed between the cable clamp and the shield termination ring, thereby reducing shield braid and wire insulation fatigue in that area.

The extension member and cable clamp insert can be installed at the time of the closing of the cable clamp of the backshell assembly. In accordance with some implementations, the extension member can be attached to the shield termination ring during the assembly of the latter. In accordance with other implementations, the extension member can be integrally formed with the shield termination ring.

One aspect of the subject matter disclosed in detail below is a cable support shield termination device comprising: a shield termination ring; a curved cable clamp insert; and an extension member joined to or integrally formed with and extending between the shield termination ring and the cable clamp insert. In accordance with one embodiment, the cable support shield termination device further comprises an extension member socket joined to or integrally formed with the shield termination ring, wherein a first end of the extension member is glued inside the extension member socket and a second end of the extension member is integrally formed with the cable clamp insert. In this case, the extension member socket may be integrally formed with the shield termination ring. The purpose of the extension member socket is to allow the extension member to be cut to the exact length needed for the installation. The extension member can be installed and glued into the extension member socket to hold it permanently.

Another aspect of the subject matter disclosed herein is a wire harness termination assembly comprising: a shield termination ring; a curved cable clamp insert; an extension member joined to or integrally formed with and extending between the shield termination ring and the cable clamp insert; a backshell; a cable clamp; and a pair of arms coupled to and extending between the backshell and the cable clamp, wherein the curved cable clamp insert is disposed radially inward of the cable clamp. This wire harness termination assembly may further comprise an extension member socket joined to or integrally formed with the shield termination ring, wherein a first end of the extension member is glued inside the extension member socket and a second end of the extension member is integrally formed with the cable clamp insert. Again the extension member socket may be integrally formed with the shield termination ring. The wire harness termination assembly may further comprise: an electrical connector coupled to the backshell; and an electrical wire that passes through the shield termination ring, the cable clamp and the backshell and is electrically connected to the electrical connector.

In accordance with some implementations, the cable clamp insert may extend circumferentially along an arc greater than 360 degrees and comprises first and second edge portions, the first edge portion being in contact with and overlapping the second edge portion. In accordance with other implementations, the curved cable clamp insert may form an arc that subtends an angle of 360 degrees or less, in which case the edge portions would not overlap.

A further aspect of the subject matter disclosed herein is a method for providing strain relief in a wire harness termination assembly, said method comprising: (a) placing a curved cable clamp insert adjacent a wire harness at a first axial position representing an anticipated position of a cable clamp of a backshell assembly; (b) clamping the curved cable clamp insert at said first axial position by tightening a cable clamp around the wire harness and curved cable clamp insert; (c) placing a shield termination ring adjacent the wire harness at a second axial position; and (d) supporting the cable clamp insert by way of an extension member having one end joined to or integrally formed with the shield termination ring and having another end joined to or integrally formed with the cable clamp insert. This method may further comprise: installing a backshell at a distal end of the wire harness; and supporting the cable clamp by way of a pair of arms coupled to the backshell.

In accordance with one implementation, the foregoing method may further comprise forming a shield termination ring having an extension member socket, wherein step (d) comprises inserting and gluing the one end of the extension member in the extension member socket. This implementation may further comprise the following steps performed before the one end of the extension member is inserted in the extension member socket: forming an extension member having a length greater than a separation distance separating a closed end of the extension member socket and an intersection of the cable clamp insert with the extension member when the shield termination ring and the cable clamp insert are in place; and cutting the extension member so that its length becomes equal to said separation distance.

In accordance with another implementation, the method may further comprise integrally forming the cable clamp insert and the shield termination ring with the extension member, wherein steps (a) and (c) are performed concurrently.

In accordance with a further implementation, the curved cable clamp insert has a spiral configuration and step (a) comprises encircling the curved cable clamp insert around the wire harness.

Yet another aspect is a method for providing strain relief in a wire harness termination assembly comprising: placing a curved cable clamp insert adjacent a wire harness at a first axial position, the curved cable clamp insert being joined or integrally formed with an extension member; clamping the curved cable clamp insert at the first axial position; placing a shield termination ring around the wire harness at a second axial position, the shield termination ring being joined or integrally formed with an extension member socket; and affixing the extension member in the extension member socket.

Other aspects of systems and methods for providing support to wire harnesses in a vibration environment are disclosed below.

BRIEF DESCRIPTION OF THE DRAWINGS

Reference will hereinafter be made to the drawings in which similar elements in different drawings bear the same reference numerals.

DETAILED DESCRIPTION

The following detailed description is illustrative in nature and not intended to limit claim coverage to the disclosed embodiments or the disclosed applications and uses of the disclosed embodiments.

A backshell assembly typically provides a transition from a plurality of electrical conductors to an electrical connector. Optionally, the backshell assembly can be configured to provide strain relief in the wire harness being terminated.

Figure 1:
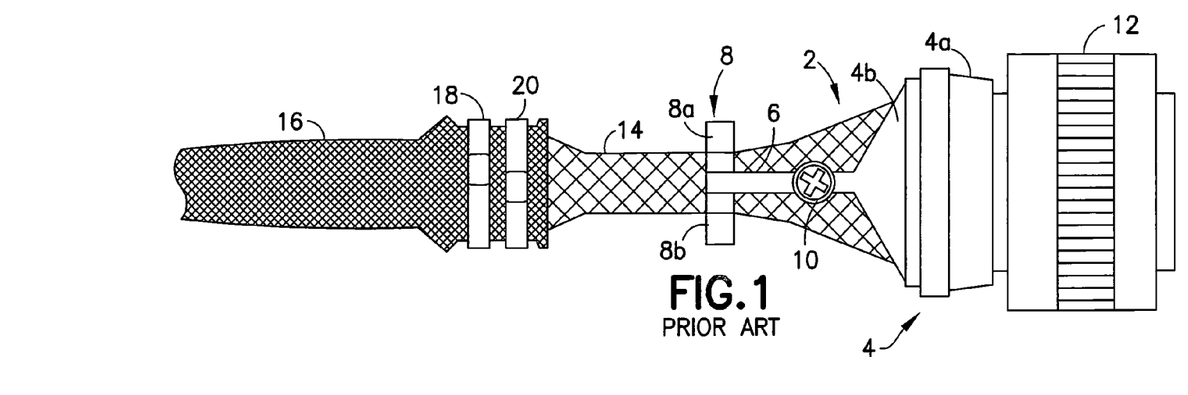
FIG. 1 is a diagram showing a side view of a prior art wire harness termination assembly.

A known backshell assembly 2, shown in FIG. 1, provides a radial clamping force relative to a wire harness (e.g., a cable or wire bundle) to prevent axial forces from damaging the termination of the wires at an electrical connector 12. The backshell assembly shown in FIG. 1 comprises a backshell 4 (coupled to the connector 12), a pair of strain relief arms 6 (only one of which is visible in FIG. 1) coupled to the backshell 4, and a mechanical cable clamp 8 which is fastened to the strain relief arms 6.

The body of backshell 4 comprises a ring portion 4a and a pair of plate portions 4b (only one of which is visible in FIG. 1), the latter being respectively coupled to the pivotable strain relief arms 6 by pivot joints 10. The body of backshell 4 may be formed from various materials, such as an aluminum alloy, stainless steel or a composite plastic material.

The strain relief arms 6 are pivotably coupled to the respective plate portions of the backshell 4 with suitable fasteners. The fasteners may be pins, rivets or screws or any means which enables the strain relief arms 6 to pivot with respect to the backshell 4. The strain relief arms 6 are adapted to be rotated between various positions including −90 and +90 degrees. The strain relief arms 6 may be secured at various detent positions relative to the axis of the backshell 4. The spacing between the strain relief arms 6 as well as the diameter of the backshell 4 are selected to receive a wire harness.

The cable clamp 8 comprises a pair of complementary saddle bars 8a, 8b. Conventional fasteners (not shown in FIG. 1) are used to tighten the saddle bars 8a, 8b to provide a radial clamping force to prevent the cable or wire harness from moving in an axial direction.

The wire harness (not visible in FIG. 1) is disposed inside overall braided shielding 14 from the backshell 4 and overall braided shielding 16 from the wire harness. The overall braided shielding 14 and overall braided shielding 16 overlap along the length of a shield termination ring (not visible in FIG. 1, but see shield termination ring 24 in FIG. 2). The overlapping braided shielding is held against the circumference of the shield termination ring by a pair of bands 18 and 20.

Figure 2:
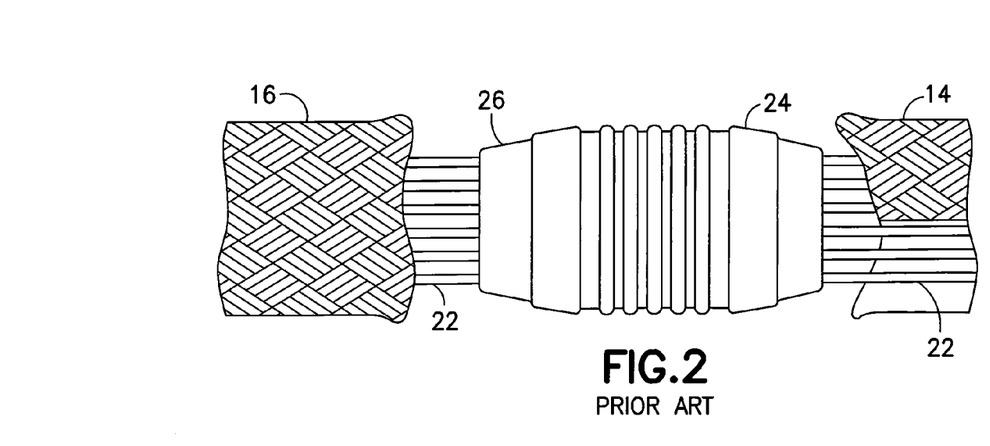
FIG. 2 is a diagram showing a side view of a portion of the wire harness termination assembly depicted in FIG. 1, various components (such as shielding) being removed to reveal a shield termination ring.

FIG. 2 shows a side view of a portion of the wire harness termination assembly depicted in FIG. 1 with portions of the overall braided shielding 14 and 16 removed to reveal the shield termination ring 24. A plurality of conductors 22 pass through the shield termination ring 24. One or more layers of build-up tape 26 are wound around the wire harness at the location of the shield termination ring 24 to prevent movement of the latter. Although not shown in FIG. 2, the overall braided shielding 16 from the wire harness will terminate at the far right-hand edge (as seen in FIG. 2) of the shield termination ring 24.

In some circumstances, shield braid and wire insulation fatigue may occur in the wire harness region disposed between the cable clamp 8 (see FIG. 1) and the shield termination ring 24 (see FIG. 2) due to in-service vibrations. This is a result of a lack of strain relief in that region. To mitigate this problem, a cable support shield termination device can be installed that incorporates the shield termination ring. This cable support shield termination device may take the form of a shield termination ring having an extended member joined to or integrally formed with a curved cable clamp insert. The purpose of the extended arm and curved cable clamp insert is to provide support to the portion of the wire harness disposed between the cable clamp and the shield termination ring, thereby reducing shield braid and wire insulation fatigue in that area. The curved cable clamp insert can be installed at the time of the closing of the cable clamp of the backshell assembly. In accordance with some implementations, the extension member can be installed during the assembly of the shield termination ring. In accordance with other implementations, the extension member can be integrally formed with the shield termination ring.

Figure 3:
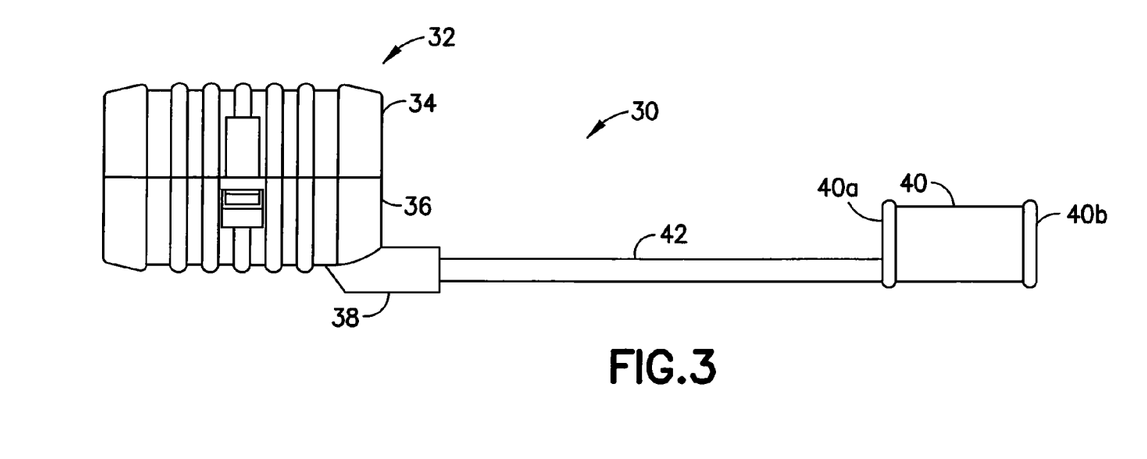
FIG. 3 is a diagram showing a side view of a cable support shield termination device in accordance with one embodiment. This cable support shield termination device comprises a split shield termination ring (shown in a closed state), an extension member inserted in a socket, and a curved cable clamp insert.

FIG. 3 shows a side view of a cable support shield termination device 30 in accordance with one embodiment. Cable support shield termination device 30 comprises a split shield termination ring 32 (formed by split ring halves 34 and 36), an extension member 42 inserted in an extension member socket 38 which is joined to or integrally formed with the split ring half 36, and a curved cable clamp insert 40 which is joined to or integrally formed with one end of the extension member 42. The other end of the extension member 42 is inserted and glued inside the extension member socket 38. The purpose of the extension member socket 38 is to allow the beam-shaped extension member 42 to be cut to the exact length needed for the installation. The components of the cable support shield termination device 30 are preferably made of high-temperature plastic or composite material.

The cable clamp insert 40 further comprises flanges 40a and 40b, which bound a region in which one or more layers of tape will be wound around the wire harness and cable clamp insert (as will be described later with reference to FIG. 7B).

Figure 4:
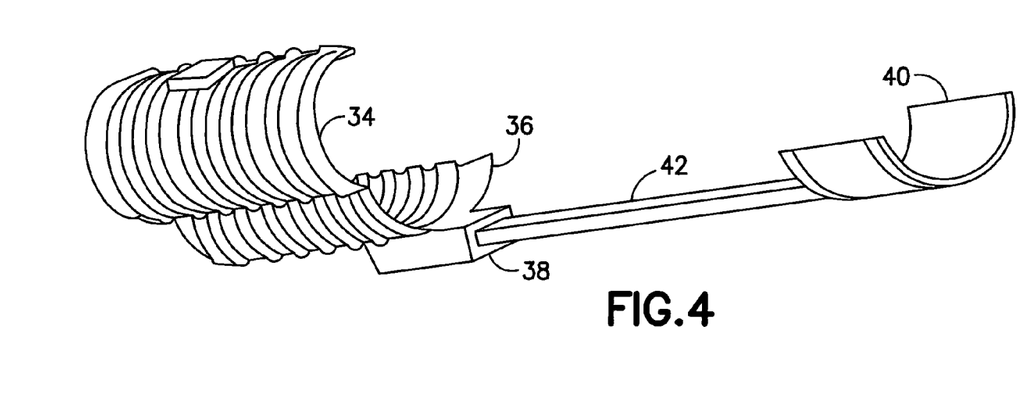
FIG. 4 is a diagram showing an isometric view of the cable support shield termination device depicted in FIG. 3, except that the split shield termination ring is shown in an open state.

FIG. 4 shows an isometric view of the cable support shield termination device 30 depicted in FIG. 3, with the difference that the split shield termination ring 32 is shown in a closed state in FIG. 3 and in an open state in FIG. 4. In the embodiment depicted in FIGS. 3 and 4, the curved cable clamp insert 40 has an arc slightly less than 180 degrees. However, the angle subtended by the arc of the curved cable clamp insert 40 may be less than, equal to or greater than 180 degrees.

Figure 5:
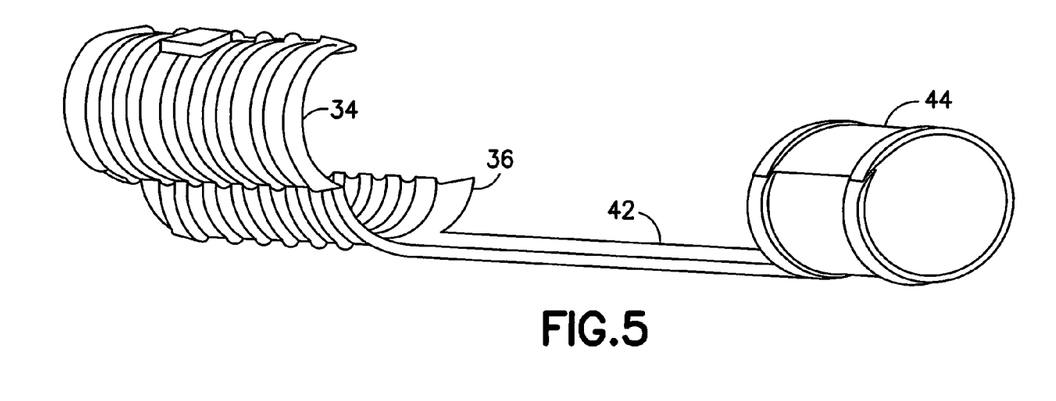
FIG. 5 is a diagram showing an isometric view of a cable support shield termination device in accordance with an alternative embodiment. This cable support shield termination device comprises a split shield termination ring (shown in an open state), an extension member, and a cable clamp insert having a spiral configuration.

FIG. 5 shows a side view of a cable support shield termination device in accordance with an alternative embodiment. This cable support shield termination device comprises a split shield termination ring formed by split ring halves 34 and 36, an extension member 42 having one end joined to or integrally formed with the split ring half 36, and a curved cable clamp insert 44, having a spiral configuration, which is joined to or integrally formed with the other end of the extension member 42. Alternatively, the one end of the extension member 42 can be inserted and glued in an extension member socket joined to or integrally formed with the shield termination ring 32, as previously described with reference to FIG. 3.

Figure 6:
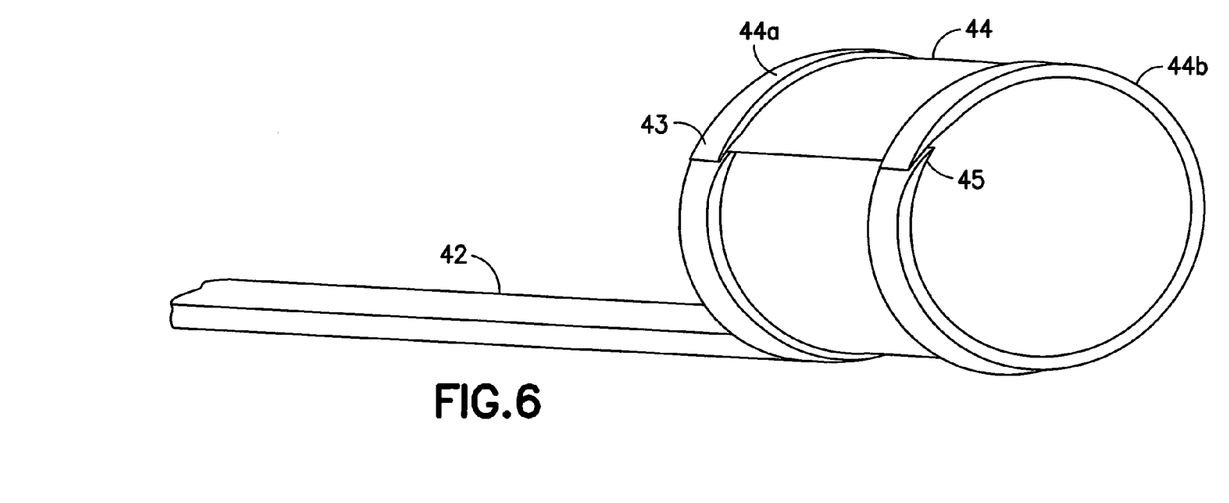
FIG. 6 is a diagram showing a portion of FIG. 5 on a magnified scale.

FIG. 6 shows an isometric view of the curved cable clamp insert 44 and a portion of the extension member 42 depicted in FIG. 5 on a magnified scale. In this implementation, the cable clamp insert 44 extends circumferentially along an arc greater than 360 degrees and comprises a first edge portion 43 that is in contact with and overlaps a second edge portion 45. The cable clamp insert 44 further comprises flanges 44a and 44b, between which layers of tape can be wound around the cable clamp insert 44.

Figure 7A:
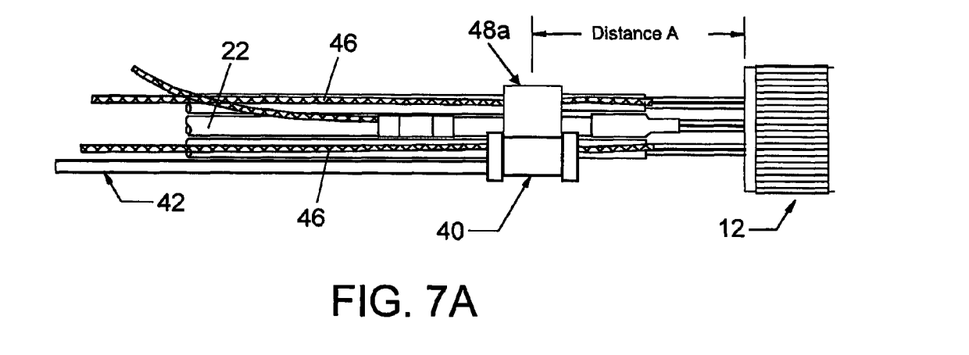
FIGS. 7A through 7D are diagrams showing side views of some components of a wire harness termination assembly at respective stages of an assembly process in accordance with one embodiment. The wire harness termination assembly being assembled in this example will have a cable support shield termination device of the type depicted in FIGS. 3 and 4.

A process for installing the cable support shield termination device 30 shown in FIG. 3 will now be described with reference to FIGS. 7A through 7D for the purpose of illustration. FIGS. 7A and 7B show side views of some components of a wire harness termination assembly at respective stages of a process for assembling a backshell assembly that has a strain relief clamp with the cable support shield termination device. FIGS. 7C and 7D show side views of some components of a wire harness termination assembly at respective stages of a process for assembling the cable support shield termination device.

In accordance with one implementation, the process for assembling the backshell assembly may comprise the following steps:

(1) Put the backshell 4 (not shown in FIGS. 7A-7D) on the wire harness, making sure that the coupling ring of the backshell points forward toward the end of the harness.

(2) Measure a Distance A from the front of the backshell 4 to the center of the screws which fasten the cable clamp 8.

(3) Wind two to four layers of PTFE tape around the diameter of the wire harness at the location on the harness that is equal to Distance A from the rear of the connector 12, making sure that: (a) the center of the tape is at Distance A; (b) the tape makes an overlap with itself; and (c) the tape is not on a shield ground wire.

(4) Fold each shield ground wire back on the tape. (The shield ground wires 46 are seen in FIG. 7A, which shows the assembly process at a subsequent stage.)

(5) Wind two to four layers of PTFE tape 48a (see FIG. 7A) around the diameter of the wire harness at the location on the harness that is equal to Distance A from the rear of the connector 12, making sure that the center of the tape 48a is at Distance A and the tape 48a makes an overlap with itself.

(6) Place the cable clamp insert 40 on the layer of PTFE tape 48 (see FIG. 7A).

(7) Wind two to four layers of PTFE tape 48b around the diameter of the wire harness at the center of the cable clamp insert 40 (see FIG. 7B), making sure that the center of the tape 48b is at the center of the cable clamp insert 40 and the tape 48b makes an overlap with itself.

(8) Install the backshell 4 on the connector 12 (not shown in FIGS. 7A-7D).

(9) Fully extend the shield sock (i.e., overall braided shielding 14 seen in FIG. 1) rearward along the wire harness.

(10) Wind layers of Type I silicone tape on the shield sock to increase the diameter where the cable clamp 8 (not yet installed) will hold the wire harness. The diameter of the wire harness must be sufficient for the cable clamp 8 to hold the wire harness tightly.

(11) Assemble a lacing tape wire harness tie on the shield sock a short distance forward of the axial position where the cable clamp 8 will be placed.

(12) Place one saddle bar that has captive fasteners on the wire harness and the strain relief arms 6 of the backshell assembly. Make sure that the sleeves of the captive fasteners are in the holes in the strain relief arms 6.

(13) Align the holes of another saddle bar with the holes in the strain relief arms 6.

(14) Engage the threads of each cable clamp screw and the captive fasteners.

(15) Tighten a cable clamp screw on one side of the saddle bar by hand.

(16) Tighten the cable clamp screw on the other side of the saddle bar by hand.

(17) Torque the cable clamp screws. Make sure that the wire harness does not move in the saddle bars, thereby completing the installation of the cable clamp 8.

Figure 7B:
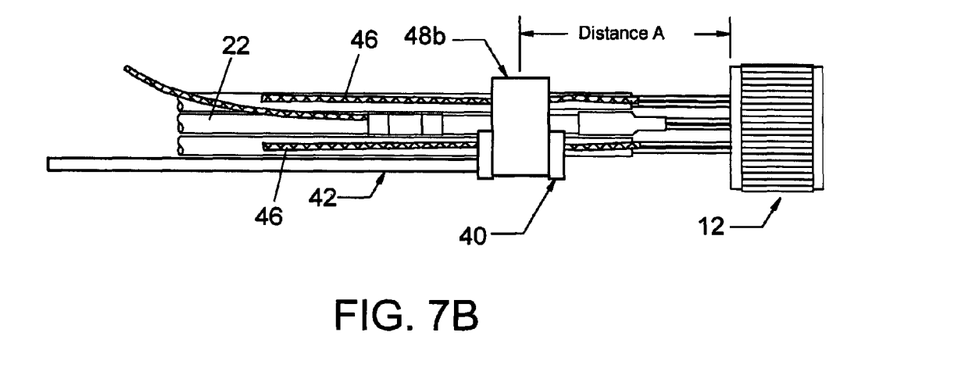
Figure 7C:
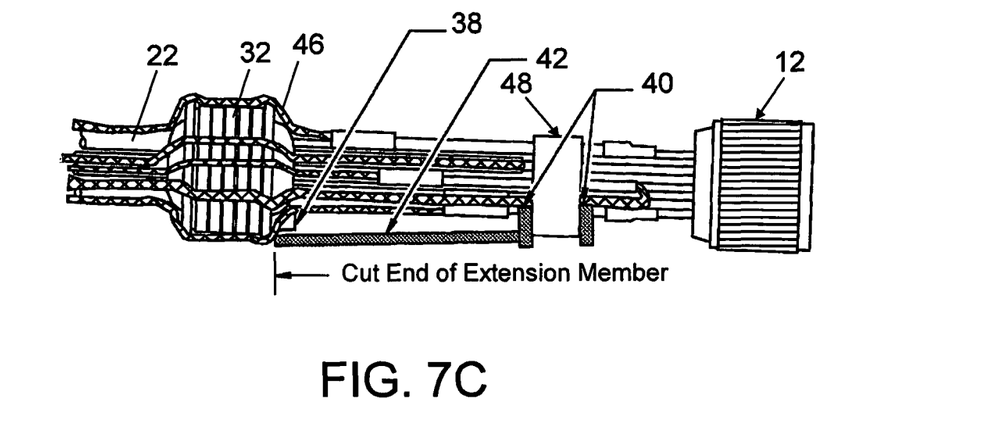
Figure 7D:
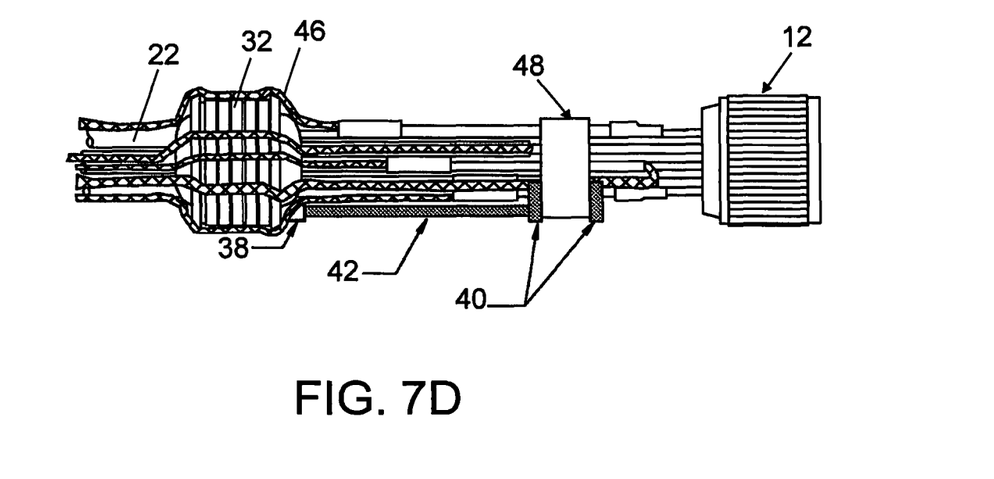

In accordance with the exemplary installation process being described, a process for installing the cable support shield termination device 30 shown in FIG. 3 on the wire harness shown in FIG. 7B may comprise the following steps:

(1) Select a shield termination ring having the smallest size that will allow the wire harness, its tape layer, and guard wire or ground connection wire to go through the ring after the ring is installed.

(2) Push the end of the shield sock forward until the end of the sock is between the strain relief arms of the backshell assembly.

(3) Wind a minimum of one layer of silicone tape around the wire harness at the location where the shield termination ring 34 will be installed.

(4) Put each guard wire or ground connection wire against the layer of tape, making sure that the wires do not cross each other.

(5) Assemble the two halves of the shield termination ring 32 on the center of the silicone tape (see FIG. 7C), making sure that: (a) the extension member socket 38 points forward; (b) the extension member socket 38 is aligned with the extension member 42; (c) the shield termination ring 32 is fully closed; and (d) the shield termination ring 34 does not move on the wire harness.

(6) If the tape does not prevent the movement of the shield termination ring, wind more layers of the tape on the harness.

(7) Remove the unwanted length of the extension member 42, making sure that the cut end of the extension member 42 is aligned with the edge of the shield termination ring, as seen in FIG. 7C.

(8) Put adhesive on the cut end of the extension member 42.

(9) Push the cut end of the extension member 42 into the cavity of the extension member socket 38, as seen in FIG. 7D.

(10) Put the shield ground wires 46 on the shield termination ring 32 at approximately equal intervals, making sure that the shield ground wires 46 do not cross each other.

(11) For a wire harness that has a guard wire, a ground connection wire, or an equipment ground wire: (a) fold each shield ground wire 46 back on the shield termination ring 32; and (b) wind two or three layers of PTFE tape on the folded shield ground wires.

(12) Wind two to four layers of PTFE tape (not shown in FIG. 7D) on the end of the shield ground wires 46 and the wire harness.

(13) Remove the unwanted length from the end of the shield ground wires.

Figure 8:
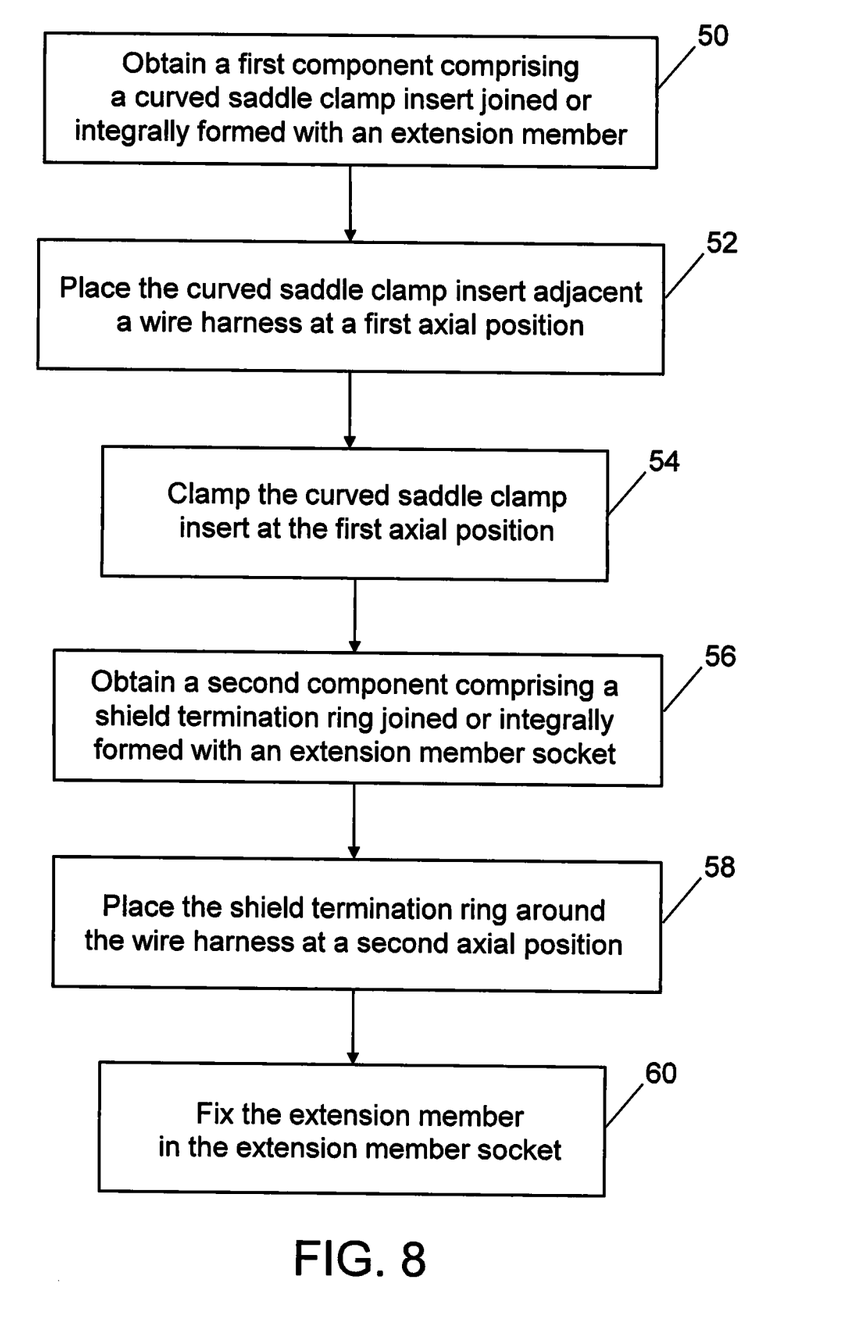
FIG. 8 is a flowchart listing some procedures in a process for assembling a wire harness termination assembly having a cable support shield termination device of the type depicted in FIGS. 3 and 4.

The installation process described with reference to FIGS. 7A-7D may be varied. Preferably, such process variations would include at least the common steps listed in the flowchart of FIG. 8. That flowchart is a listing some procedures in a method for assembling a wire harness termination assembly having a cable support shield termination device of the type depicted in FIGS. 3 and 4. This method for providing strain relief in a wire harness termination assembly comprises the following steps: obtaining a first component comprising a curved cable clamp insert 40 joined or integrally formed with an extension member 42 (step 50); placing the curved cable clamp insert 40 adjacent a wire harness at a first axial position (step 52); clamping the curved cable clamp insert 40 at the first axial position (step 54); obtaining a second component comprising a shield termination ring 32 joined or integrally formed with an extension member socket 38 (step 56); placing the shield termination ring 32 around the wire harness at a second axial position (step 58); and fixing the extension member 42 in the extension member socket 38 (step 60). The first and second axial positions correspond to the respective axial positions of the cable clamp insert 40 and shield termination ring 32 seen in FIG. 7C. The term "obtaining" a component should be construed to encompass at least the following: fabricating the component, purchasing a pre-fabricated component, and selecting the component from inventory.

While methods and devices for providing strain relief in the region between a cable clamp and a shield termination ring of a wire harness termination assembly in a vibration environment have been described with reference to various embodiments, it will be understood by those skilled in the art that various changes may be made and equivalents may be substituted for elements thereof without departing from the scope of the claims set forth hereinafter. In addition, many modifications may be made to adapt the teachings herein to a particular situation without departing from the scope of the claims. For avoidance of doubt, there are many other ways of providing a mechanical support extending from a cable clamp of a backshell assembly to a shield termination ring. Such mechanical support can be any sufficiently stiff member joined to or integrally formed with the cable clamp and the shield termination ring.

The method claims set forth hereinafter should not be construed to require that the steps recited therein be performed in alphabetical order (alphabetical ordering in the claims is used solely for the purpose of referencing previously recited steps) or in the order in which they are recited. Nor should they be construed to exclude two or more steps or portions thereof being performed concurrently or to exclude any portions of two or more steps being performed alternatingly.

As used in the claims, the term "joined" should be construed to encompass at least the following terms: fixedly coupled, connected, fastened, bonded (e.g., glued), and welded.

The invention claimed is:

1. A cable support shield termination device comprising:
   a shield termination ring;
   a curved cable clamp insert; and
   an extension member joined to or integrally formed with and extending between said shield termination ring and said cable clamp insert, said extension member being constructed so that said shield termination ring is fixedly connected to and supports said cable clamp insert by way of said extension member.

2. The cable support shield termination device as recited in claim 1, further comprising an extension member socket joined to or integrally formed with said shield termination ring, wherein a first end of said extension member is operable to be affixed within said extension member socket.

3. The cable support shield termination device as recited in claim 2, wherein said first end of said extension member socket is integrally formed with said shield termination ring.

4. The cable support shield termination device as recited in claim 1, wherein a second end of said extension member is integrally formed with said cable clamp insert.

5. The cable support shield termination device as recited in claim 1, wherein said cable clamp insert extends circumferentially along an arc greater than 360 degrees.

6. The cable support shield termination device as recited in claim 5, wherein said cable clamp insert comprises first and second edge portions, said first edge portion being in contact with and overlapping said second edge portion.

7. The cable support shield termination device as recited in claim 1, wherein said extension member is beam-shaped.

8. A wire harness termination assembly comprising:
   a shield termination ring;
   a curved cable clamp insert;
   an extension member joined to or integrally formed with and extending between said shield termination ring and said cable clamp insert;
   a backshell;
   a cable clamp; and
   a pair of arms coupled to and extending between said backshell and said cable clamp,
   wherein said curved cable clamp insert is disposed radially inward of said cable clamp.

9. The wire harness termination assembly as recited in claim 8, further comprising an extension member socket joined to or integrally formed with said shield termination ring, wherein a first end of said extension member is operable to be affixed within said extension member socket.

10. The wire harness termination assembly as recited in claim 9, wherein said extension member socket is integrally formed with said shield termination ring.

11. The wire harness termination assembly as recited in claim 9, wherein a second end of said extension member is integrally formed with said cable clamp insert.

12. The wire harness termination assembly as recited in claim 8, wherein said shield termination ring is split.

13. The wire harness termination assembly as recited in claim 8, wherein said cable clamp insert extends circumferentially along an arc greater than 360 degrees.

14. The wire harness termination assembly as recited in claim 8, wherein said cable clamp insert comprises first and second edge portions, said first edge portion being in contact with and overlapping said second edge portion.

15. The wire harness termination assembly as recited in claim 8, further comprising:
   an electrical connector coupled to said backshell; and
   an electrical wire that passes through said shield termination ring, said cable clamp and said backshell and is electrically connected to said electrical connector.

16. A method for providing strain relief in a wire harness termination assembly, said method comprising:
   (a) placing a curved cable clamp insert adjacent a wire harness at a first axial position representing an anticipated position of a cable clamp of a backshell assembly;
   (b) clamping the curved cable clamp insert at said first axial position by tightening a cable clamp around the wire harness and curved cable clamp insert;
   (c) placing a shield termination ring adjacent the wire harness at a second axial position; and
   (d) supporting the cable clamp insert by way of an extension member having one end joined to or integrally formed with the shield termination ring and having another end joined to or integrally formed with the cable clamp insert.

17. The method as recited in claim 16, further comprising forming a shield termination ring having an extension member socket, wherein step (d) comprises inserting and gluing the one end of the extension member in the extension member socket.

18. The method as recited in claim 17, further comprising the following steps performed before the one end of the extension member is inserted in the extension member socket:
   forming an extension member having a length greater than a separation distance separating a closed end of the extension member socket and an intersection of the cable clamp insert with the extension member when the shield termination ring and the cable clamp insert are in place; and
   cutting the extension member so that its length becomes equal to said separation distance.

19. The method as recited in claim 16, further comprising integrally forming the cable clamp insert and the shield termination ring with the extension member, wherein steps (a) and (c) are performed concurrently.

20. The method as recited in claim 16, wherein step (a) comprises encircling the curved cable clamp insert around the wire harness.

21. The method as recited in claim 16, further comprising:
   installing a backshell at a distal end of the wire harness; and
   supporting the cable clamp by way of a pair of arms coupled to the backshell.

22. A method for providing strain relief in a wire harness termination assembly, said method comprising:
   placing a curved cable clamp insert adjacent a wire harness at a first axial position, the curved cable clamp insert being joined or integrally formed with an extension member;
   clamping the curved cable clamp insert at the first axial position;
   placing a shield termination ring around the wire harness at a second axial position, the shield termination ring being joined or integrally formed with an extension member socket; and
   placing a portion of the extension member in the extension member socket.

* * * * *